(12) United States Patent
Yokoi et al.

(10) Patent No.: US 7,719,310 B2
(45) Date of Patent: May 18, 2010

(54) SEMICONDUCTOR INTEGRATED CIRCUIT DEVICE AND METHOD FOR MANUFACTURING THE SAME

(75) Inventors: Akinori Yokoi, Ome (JP); Shigeru Nakahara, Higashiyamato (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/350,681

(22) Filed: Jan. 8, 2009

(65) Prior Publication Data

US 2009/0243658 A1 Oct. 1, 2009

(30) Foreign Application Priority Data

Mar. 31, 2008 (JP) .............................. 2008-089136

(51) Int. Cl.
*H03K 19/003* (2006.01)
(52) U.S. Cl. ........................................... 326/33; 326/21
(58) Field of Classification Search ................... 326/21, 326/31, 33–34
See application file for complete search history.

(56) References Cited

U.S. PATENT DOCUMENTS

| 6,593,799 | B2 * | 7/2003 | De et al. ...................... 327/534 |
| 6,934,171 | B2 * | 8/2005 | Dillon et al. ................. 363/147 |
| 7,358,555 | B2 * | 4/2008 | Iwamatsu et al. ........... 257/296 |
| 2001/0045873 | A1 | 11/2001 | Suzuki et al. |

FOREIGN PATENT DOCUMENTS

JP 2001-339288 A 12/2001
JP 2004-327820 A 11/2004

OTHER PUBLICATIONS

Xiongfei Meng et al. "Novel Decoupling Capacitor Designs for sub-90nm CMOS Technology", IEEE Proceedings of the 7th International Symposium on Quality Electronic Design 2006.
Bernd Garben et al. "Influence of Damping and Voltage Dependent Leakage Resistance on Mid-Frequency Power Noise", IEEE Signal Propagation on Interconnects, 2004, pp. 45-48.
Patrik Larsson, "Parasitic Resistance in an MOS Transistor Used as On-Chip Decoupling Capacitance", IEEE Journal of Solid-State Circuits, vol. 32, No. 4, Apr. 1997, pp. 574-576.

* cited by examiner

*Primary Examiner*—James Cho
(74) *Attorney, Agent, or Firm*—Miles & Stockbridge P.C.

(57) ABSTRACT

A circuit for attaining reduction in AC noise on power supply line caused by IR drop upon use of a decoupling capacitor represented by a cross-coupled decoupling capacitor with enhanced resistance to electrostatic breakdown, required in the case of a process of a high technology. There is also provided a circuit for suppressing the AC noise on power supply line due to resonance. MOS transistors composing the cross-coupled decoupling capacitor with enhanced resistance to electrostatic breakdown are caused to have lower threshold voltages Vth, thereby reducing a resistance between a source and a drain of each of the MOS transistors, resulting in reduction in IR drop. Further, a damping resistance is effective for suppressing the AC noise on power supply line, and the source-to-drain resistance of each of the MOS transistors is utilized as the damping resistance. At this point in time, a resistance value as desired is attained through combination of decoupling capacitors having threshold voltages Vth differing from each other.

8 Claims, 8 Drawing Sheets

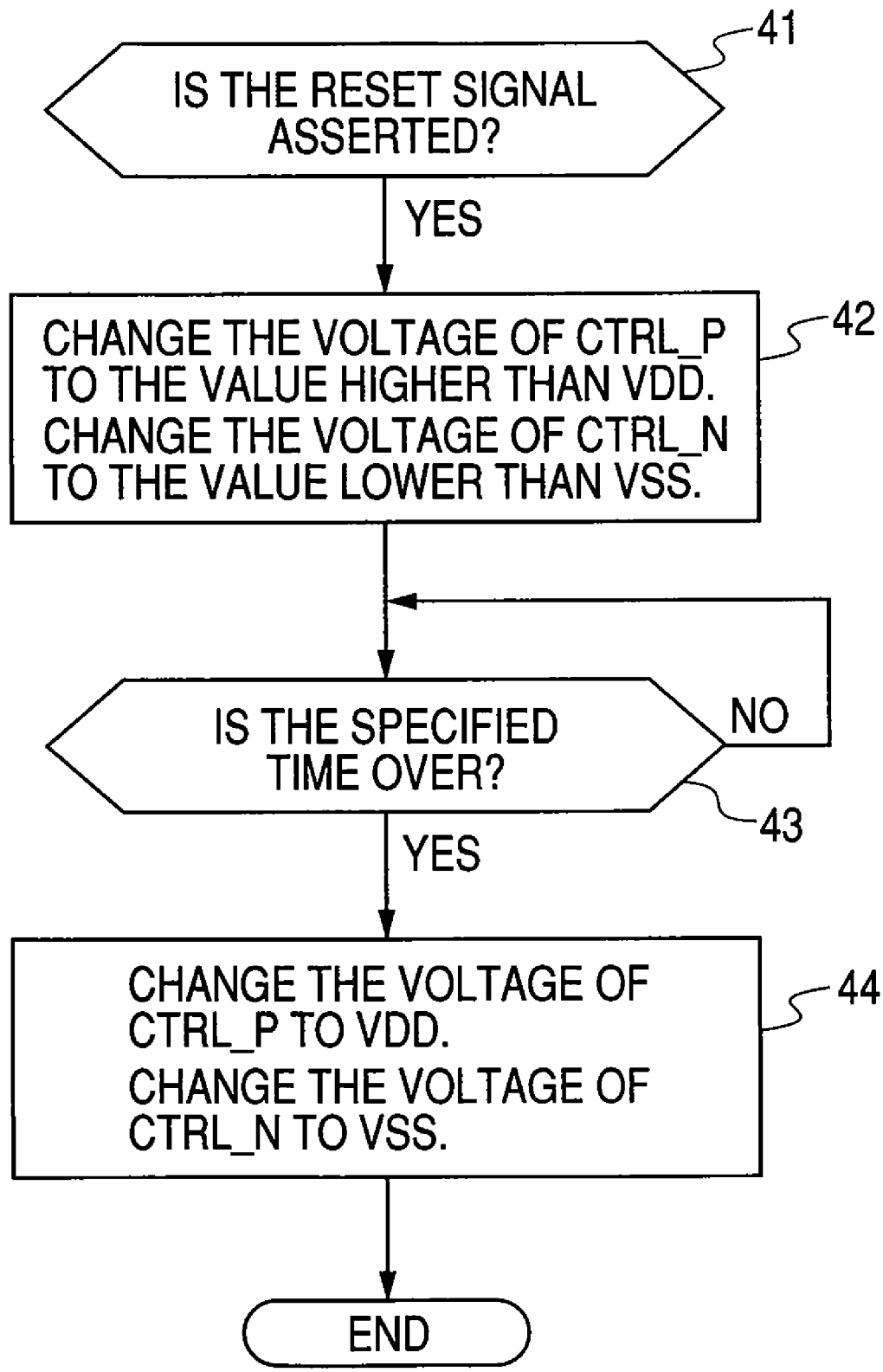

SEMICONDUCTOR INTEGRATED CIRCUIT DEVICE AND METHOD FOR MANUFACTURING THE SAME

CLAIM OF PRIORITY

The present application claims priority from Japanese patent application JP 2008-089136 filed on Mar. 31, 2008, the content of which is hereby incorporated by reference into this application.

FIELD OF THE INVENTION

The invention relates to an on-chip decoupling capacitor mounted on a semiconductor integrated circuit.

BACKGROUND OF THE INVENTION

A transient variation (referred to as an AC noise on power supply line) in power supply voltage, attributable to a current flowing at the time of a circuit in operation, (a current flowing at the time of transition in circuit condition, called a switching current in a CMOS circuit) occurs to a semiconductor integrated circuit. If the AC noise on power supply line is large in magnitude, this will cause malfunction of a circuit in the worst case, and there is therefore the need for suppressing the AC noise on power supply line to fall within a normally operable range.

As a margin for the AC noise on power supply line has since decreased due to reduction in voltage of a semiconductor integrated circuit, as seen lately, in particular, so has increased importance attached to suppression of variation in power supply voltage. Further, there is the need for lowering the AC noise on power supply line occurring to the semiconductor integrated circuit in consideration of an increase in importance attached to EMC (Electro-Magnetic-Compatibility).

For example, in JP-A-2001-339288, an RC filter is added to a power supply line, attempting to decrease the noise. With the RC filter, however, there occurs drop in power supply, due to current flowing to the power supply line, and a resistor as a component of the filter.

If a capacitor called a decoupling capacitor is placed between power supplies (VDD and VSS) in order to suppress the AC noise on power supply line, this will provide effective means. JP-A-2004-327820 has disclosed an example of using the decoupling capacitor. In JP-A-2004-327820, there has been proposed a design idea whereby the decoupling capacitor is connected to power supply lines during a circuit operation period, and is electrically separated from the power supply lines during a non-operation period, thereby reducing a leak current in order to cope with an increase in gate leak current accompanying process miniaturization.

FIG. 1 shows an example of a decoupling capacitor. The decoupling capacitor has a configuration wherein an NMOS transistor 1 has a gate connected to VSS, having a source and a drain, connected to VDD, respectively. Further, the decoupling capacitor has a configuration wherein a PMOS transistor 2 has a gate connected to VDD, having a source and a drain, connected to VSS, respectively. Further, "a MOS transistor" referred to in description given hereinafter may be a common field effect transistor including a MIS (Metal-Insulator-Semiconductor) transistor.

Further, progress has since been made in reduction in film thickness of a gate oxide film, accompanying miniaturization in process. In IEEE Proceedings of 7th International Symposium on Quality Electronic Design 2006, a cross-coupled decoupling capacitor as shown in FIG. 2 has been proposed for the purpose of enhancement in resistance to electrostatic breakdown occurring as a result of reduction in the film thickness. With the cross-coupled decoupling capacitor, if a gate is directly connected to VDD, VSS, respectively, there occurs deterioration in electrostatic breakdown resistance, so that with respect to MOS transistors 3, 4, respectively, source-to-drain resistance is inserted between the gate and VDD, VSS, respectively, thereby implementing enhancement in the electrostatic breakdown resistance.

The AC noise on power supply line is influenced by not only the decoupling capacitor but also electrical characteristics of a package, a PCB (Printed-Circuit-Board), and so forth. For example, in IEEE Signal Propagation on Interconnects, 2004, Proceedings, pp. 45-48, it has been proposed to suppress a voltage bounce of a power supply line, due to resonance occurring to a power source, by insertion of a resistor of a suitable resistance (the resistance is called a damping resistance).

SUMMARY OF THE INVENTION

In FIG. 3, there is shown an equivalent circuit of the cross-coupled decoupling capacitor shown in FIG. 2. Resistors 5, 8 each represent the source-to-drain resistance of the MOS transistor, and capacitors 6, 7 each represent a gate capacitance. As is evident from the equivalent circuit, with the cross-coupled decoupling capacitor, the source-to-drain resistance is inserted so as to be equivalent to series-connection to the capacitor. Voltage drop (IR drop) occurring upon current flowing through the resistance between the source and the drain is the cause of occurrence of the AC noise on power supply line.

It is therefore a first object of the present invention to provide means for suppressing occurrence of the AC noise on power supply line when the cross-coupled decoupling capacitor is in use.

There is the case where addition of the damping resistance having an adequate resistance value is required in order to suppress resonance, and so forth, depending on circuit operation, a design of the package·PCB, when the decoupling capacitor is placed. Accordingly, it is a second object of the present invention to provide means for suppressing resonance caused by the decoupling capacitor.

The means for solving the first object are as follows. That is, a decoupling capacitor is made up of MOS transistors having a low threshold voltage Vth. By so doing, source-to-drain resistance of the MOS transistor, equivalently inserted, is reduced, so that the AC noise on power supply line can be reduced.

The means for solving the second object includes the following three means. A first means is to use a decoupling capacitor made up of MOS transistors having plural kinds of threshold voltages Vth, thereby using the resistance between the source and the drain as the damping resistance. In a second means, the threshold voltage Vth can be varied by controlling a substrate bias voltage. In so doing, the source-to-drain resistance of the MOS transistor, equivalently inserted, can be controlled, which will act as the damping resistance, so that resonance can be suppressed. In a third means, the source-to-drain resistance can be equivalently controlled by controlling a gate electrode voltage of the MOS transistor. As with the second means, the resonance can be suppressed.

The present invention is advantageous in that IR drop is firstly reduced. Furthermore, additional damping resistance is not required, and the noise accompanying the resonance phenomenon can be suppressed. In other words, the AC noise on power supply line can be reduced, thereby preventing a circuit from malfunctioning.

BRIEF DESCRIPTION OF THE DRAWINGS

FIG. 15 is a view showing a control flow chart of the signal shown in FIG. 13.

DETAILED DESCRIPTION OF THE PREFERRED EMBODIMENTS

Embodiments of the invention are described hereinafter with reference to a working example.

Figure 4:
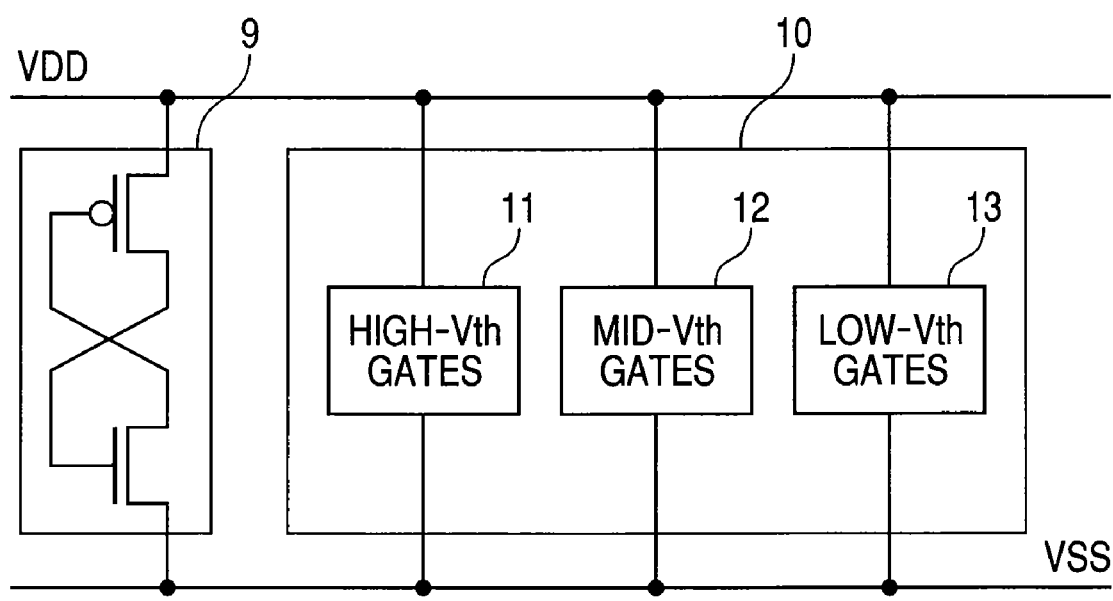
FIG. 4 is a general view showing a system LSI.

FIG. 4 is a view showing a general view of a system LSI. The system LSI comprises a decoupling capacitor 9, and a logic circuitry 10. The decoupling capacitor 9 and the logic circuitry 10 are connected between power supply lines VDD and VSS. Operating voltages from the supply lines VDD, and VSS, respectively, are fed to the logic circuitry 10.

The logic circuitry 10 provides the internal logic of the system LSI, and is comprised of MOS transistors having plural kinds of threshold voltages Vth. A circuit 11 is comprised of a MOS transistor having a high threshold voltage, a circuit 12 is comprised of a MOS transistor having a standard threshold voltage, and a circuit 13 is comprised of a MOS transistor having a low threshold voltage. In this connection, the low threshold voltage, the standard threshold voltage, and the high threshold voltage each indicate a relative voltage, and doe not indicate a specific voltage. In FIG. 4, the logic circuitry 10 is comprised of MOS transistors having three kinds of threshold voltages Vth, however, the number of the kinds of threshold voltages Vth may be any suitable number not less than two. Those threshold voltages Vth are controlled by parameters of a process step such as an ion implantation process step, and so forth.

Figure 2:
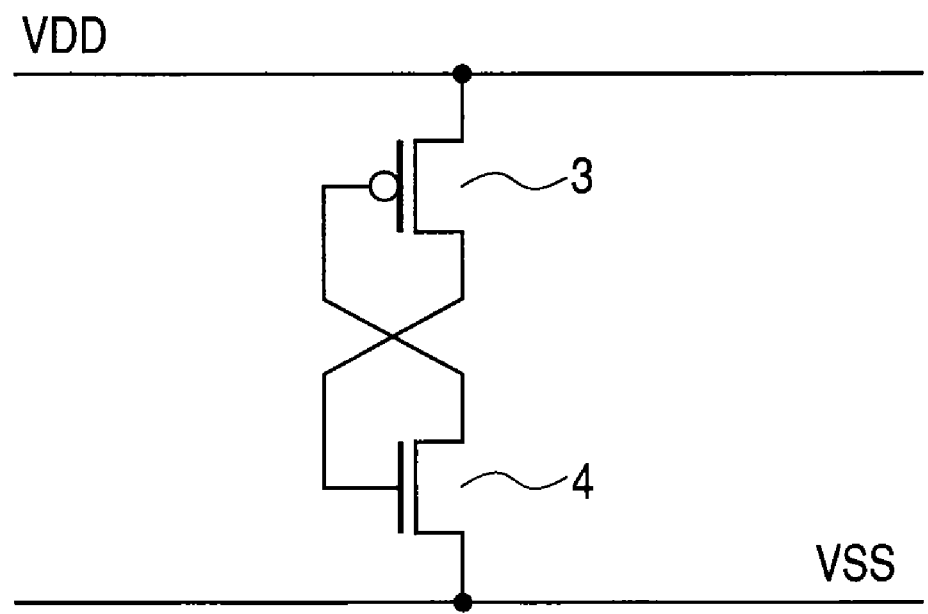
FIG. 2 is a schematic view showing an example of a cross-coupled decoupling capacitor with enhanced resistance to electrostatic breakdown.
Figure 3:
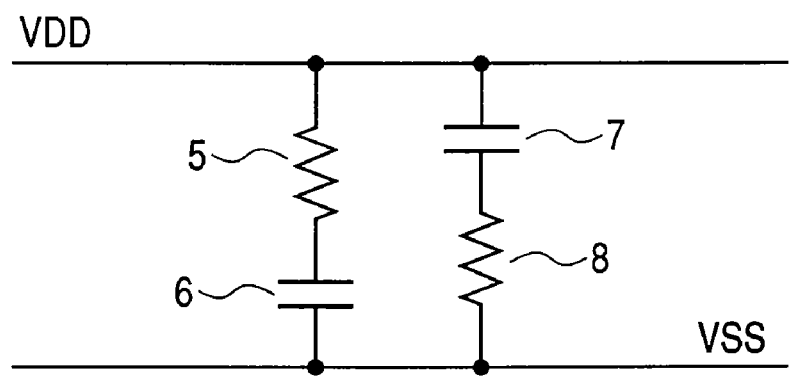
FIG. 3 is a schematic view showing an equivalent circuit using resistance and capacitance of the cross-coupled decoupling capacitor shown in FIG. 2.

The decoupling capacitor 9 is the cross-coupled decoupling capacitor shown in FIG. 2, intended for reduction of the AC noise on power supply line occurring inside the system LSI. For the cross-coupled decoupling capacitor, use is made of one of the MOS transistors used in the logic circuitry, having the lowest threshold voltage.

The decoupling capacitor is generally provided in a cell library containing a decoupling capacitor cell. In this case, it is assumed that a cell library having a decoupling capacitor cell composed of MOS transistors having a low threshold voltage Vth is prepared.

By so doing, a source-to-drain resistance in the MOS transistors composing the cross-coupled decoupling capacitor is reduced. Then, it is possible to reduce the AC noise on power supply line due to a voltage drop (IR drop) occurring when current flows through the resistance between the source and the drain.

For reference purposes, there is described hereinafter relationship between a MOS transistor threshold voltage Vth, and a source-to-drain resistance Rch. The source-to-drain resistance (referred to as Rch), posing a problem in a decoupling capacitor with enhanced resistance to electrostatic breakdown, is dependent on the respective threshold voltages Vth of the MOS transistors composing the decoupling capacitor. The relationship between the MOS transistor threshold voltage Vth and the resistance Rch can be approximately expressed by expression (1) as follows:

$$1/Rch=[(\mu \cdot Cox \cdot Wg)/Lg]*(Vgs-Vth) \qquad \text{expression (1)}$$

where μ indicates mobility, Cox a capacitance unit of a gate oxide film, Wg, $L_g$ indicate a gate with, and a gate length, respectively, and Vgs indicates a gate-source voltage. It is evident from the expression (1) that Rch can be lowered by use of a MOS transistor having a low threshold voltage Vth. That is, with the decoupling capacitor with enhanced resistance to electrostatic breakdown, it is possible to decrease IR drop by use of the MOS transistor having the low threshold voltage Vth.

Figure 1:
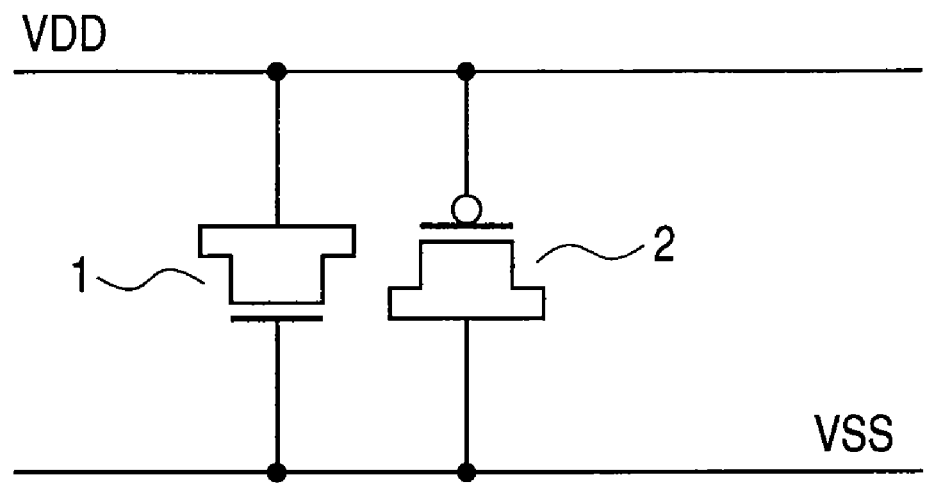
FIG. 1 is a schematic view showing an example of a decoupling capacitor.

Further, in FIG. 4, the cross-coupled decoupling capacitor is used in description; however, use can be made of the decoupling capacitor of a type shown in FIG. 1, as well. As shown in IEEE Journal of Solid-State Circuits, Vol. 32, No. 4, April, 1997, pp. 574-576, with the decoupling capacitor as well, a source-to-drain resistance Rch can act as a parasitic resistance. The source-to-drain resistance Rch is used as a resistance for suppressing resonance.

Figure 5:
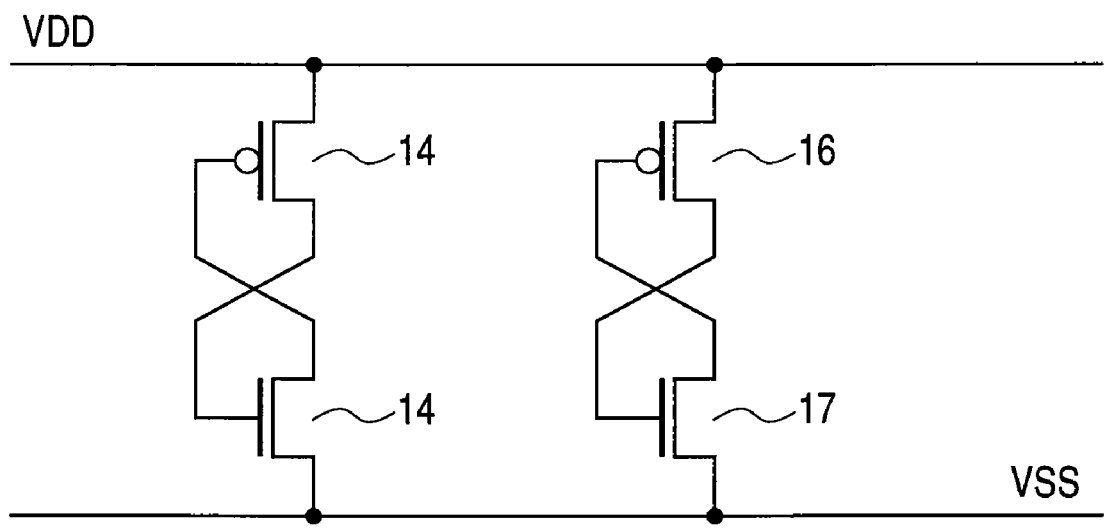
FIG. 5 is a circuit diagram of two kinds of decoupling capacitors having threshold voltages Vth differing from each other.

FIG. 5 shows the case where use is made of two kinds (a low threshold voltage, and a high threshold voltage) of decoupling capacitors having threshold voltages Vth differing from each other in place of the decoupling capacitor shown in FIG. 2, comprised of the MOS transistors having the lowest threshold voltage. MOS transistors 14, 15 each have the low threshold voltage, and MOS transistors 16, 17 each have the high threshold voltage.

In order to attain a resistance value as desired, use is made of the decoupling capacitors having threshold voltages Vth differing from each other, and control is implemented through a composite resistance of the decoupling capacitors. In this connection, it is to be pointed out that the low threshold voltage, and the high threshold voltage each indicate a relative voltage, and doe not indicate a specific voltage.

Figure 6:
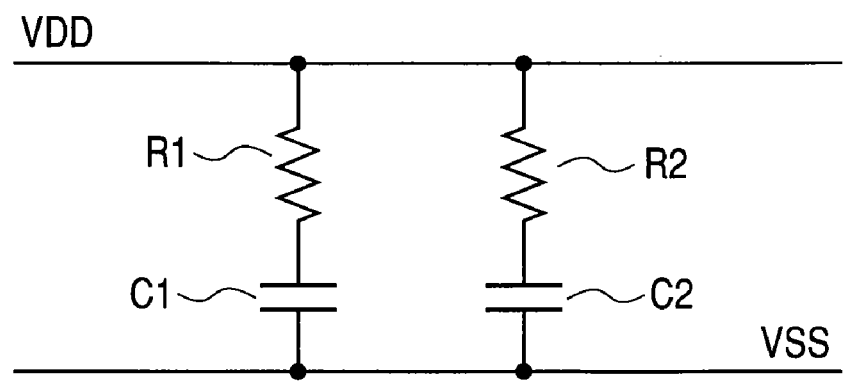
FIG. 6 is a schematic view showing an equivalent circuit using resistance and capacitance of each of the two kinds of the decoupling capacitors having the threshold voltages Vth differing from each other.

If the decoupling capacitor is made up of MOS transistors having a single threshold voltage, a capacitance value of the decoupling capacitor, and a damping resistance value thereof are dependent only on the number of decoupling capacitor cells, so that the capacitance value, and the damping resistance value cannot be independently determined. Accordingly, with the use of the decoupling capacitors having the threshold voltages differing from each other, it is possible to attain an optional capacitance value of the decoupling capacitor, and an optional damping resistance value. The attainment of the optional capacitance value, and resistance value is shown as follows:

FIG. 6 shows an equivalent circuit of the decoupling capacitors shown in FIG. 5. One decoupling capacitor is expressed by one parasitic resistance, and one parasitic capacitance, and respective parasitic resistance values, and parasitic capacitance values are designated R1, C1 and R2, C2. In this case, if composite impedance is expressed by use of "s" of Laplace transformation, the composite impedance can be approximately expressed by expression 2 as follows:

$$\frac{1}{\frac{1}{R1+\frac{1}{sC1}}+\frac{1}{R2+\frac{1}{sC2}}} \approx \frac{C1^2 \cdot R1 + C2^2 \cdot R2}{(C1+C2)^2} + \frac{1}{s \cdot (C1+C2)} \quad \text{expression (2)}$$

Figure 7:
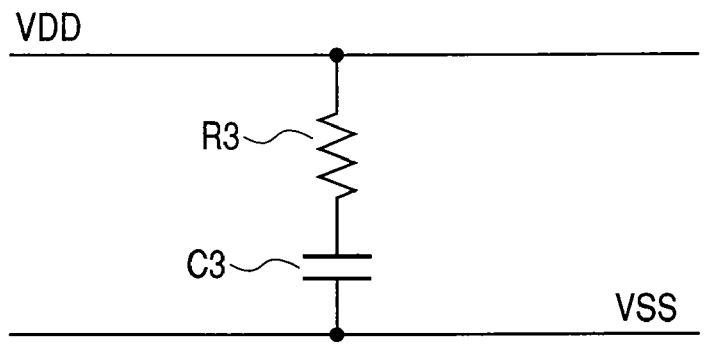
FIG. 7 is a view showing an equivalent circuit expressing the decoupling capacitor by use of resistance, and capacitance.

The expression (2) indicates a circuit identical to a circuit where a resistance value R3, and a capacitance value C3, in FIG. 7, are as expressed by expression (3), and expression (4), respectively, and an optional resistance value and an optional capacitance value can be attained as follows:

$$R3 = \frac{C1^2 \cdot R1 + C2^2 \cdot R2}{(C1+C2)^2} \quad \text{expression (3)}$$

$$C3 = C1 + C2 \quad \text{expression (4)}$$

As described above, it is evident that the optional resistance value can be attained by use of the decoupling capacitors having the threshold voltages Vth differing from each other. Thus, the optional resistance value can be attained, and it is therefore possible to suppress resonance, and so forth, due to designing of the package PCB, without the addition of the damping resistance having an adequate resistance value. The damping resistance refers to a resistance of the resistor inserted for suppressing the resonance phenomenon of the power supply voltage, due to resonance occurring to the power source.

In FIGS. 5, and 6, use is made of two kinds of the decoupling capacitors, however, there is no need for limiting the decoupling capacitors to two kinds, and use can be made of not less than three kinds of the decoupling capacitors having threshold voltages Vth differing from each other.

Further, with the decoupling capacitor shown in FIG. 1 as well, a source-to-drain resistance Rch can act as the parasitic resistance, as shown in IEEE Journal of Solid-State Circuits, Vol. 32, No. 4, April, 1997, pp. 574-576. It is possible to use the source-to-drain resistance Rch as a resistance for suppressing resonance. In order to attain a resistance value as desired, use can be made of the decoupling capacitors having threshold voltages Vth differing from each other, and control is implemented with the composite resistance of the decoupling capacitors.

Figure 8:
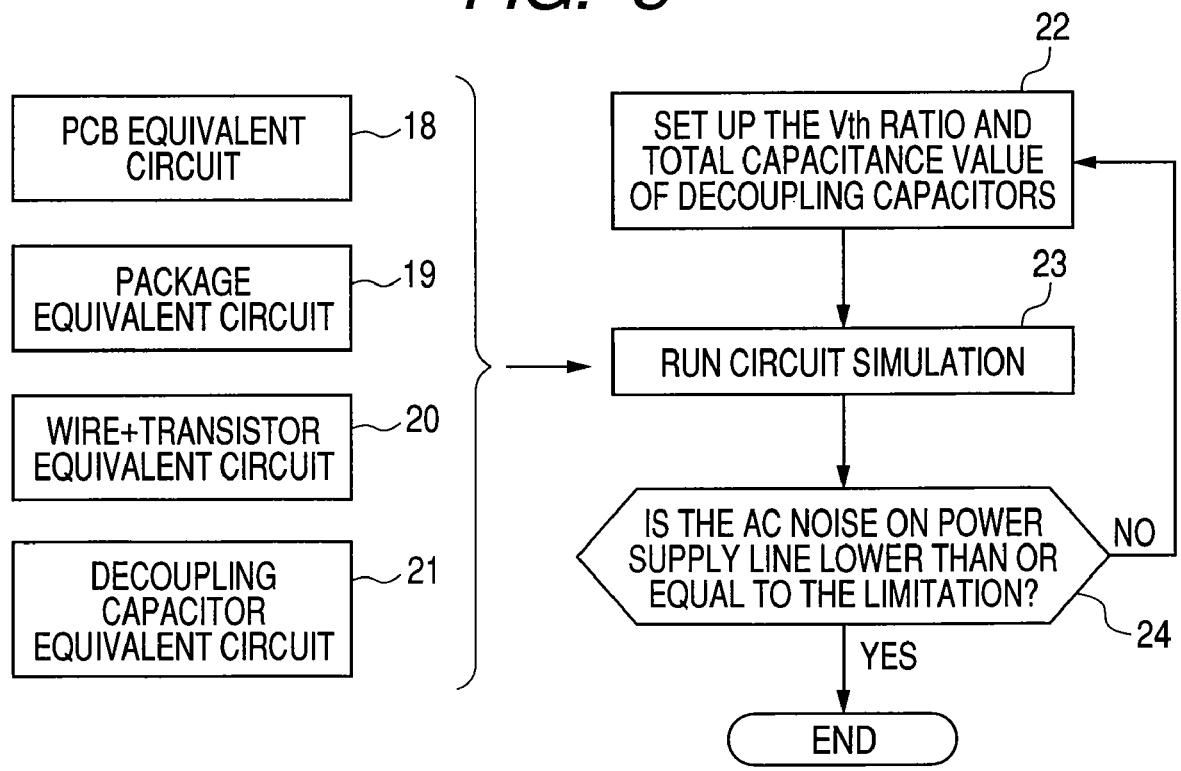
FIG. 8 is a view showing an example of a flow chart for determining capacitance of a plurality of kinds of decoupling capacitors having threshold voltages Vth differing from each other, and an application ratio of each kind of the threshold voltage Vth.

FIG. 8 shows a designing process for composing an integrated circuit by use of a plurality of decoupling capacitors having threshold voltages Vth differing from each other. In FIG. 8, indicated at 18 to 21, respectively, is information necessary for designing while indicated at 22 through 24 is a flow chart for designing with the use of the information. There are prepared respective equivalent circuits of a PCB, a package, interconnects on a substrate, MOS transistors, and a decoupling capacitor on the basis of each kind of the threshold voltage Vth.

In step 22, there are provisionally determined total capacitance of decoupling capacitors to be mounted, and an application ratio on the basis of each kind of the threshold voltage Vth. Thereafter, in step 23, there is run a circuit simulation whereby operation of an integrated circuit apparatus is simulated. Then, in step 24, checking is made on whether or not the AC noise on power supply line (in terms of magnitude, and waveform) meets a standard. If the AC noise on power supply line does not meet the standard, the process reverts to the step 22, running the circuit simulation again after changing the total capacitance of the decoupling capacitors, and the application ratio on the basis of each kind of the threshold voltage Vth.

The process described as above is repeated until the AC noise on power supply line meets the standard. Herein, the standard refers to the magnitude of the AC noise on power supply line, and the waveform thereof, necessary for ensuring that the integrated circuit apparatus is prevented from malfunctioning.

In this case, determination on the total capacitance of the decoupling capacitors, and the application ratio on the basis of each kind of the threshold voltage Vth is made by making use of the circuit simulation, however, there is no need for limiting such determination to the circuit simulation, and use may be made of, for example, an analytic formula, and numerical calculation utilizing a computer.

Figure 9:
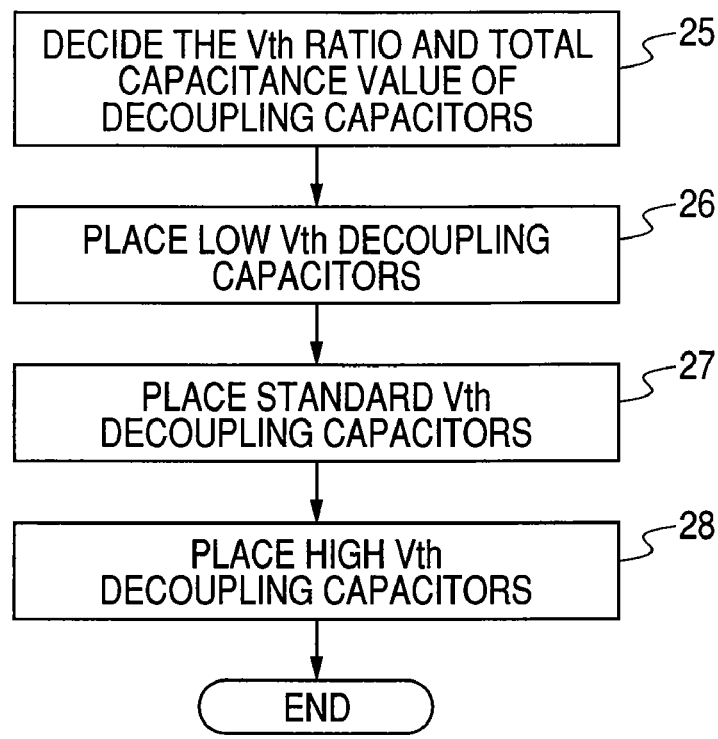
FIG. 9 is a view showing an example of a flow chart for placing the plurality of the kinds of the decoupling capacitors having the threshold voltages Vth differing from each other.

FIG. 9 shows a procedure for placing the decoupling capacitors. The decoupling capacitors are generally provided in the cell library containing decoupling capacitor cell. In this case, it is assumed that use is made of a cell library having three kinds of decoupling capacitor cells having a high threshold voltage Vth, standard threshold voltage Vth, and low threshold voltage Vth, respectively. Obviously, there is no need for limiting the decoupling capacitor cells to three kinds, and the number of kinds of decoupling capacitor cells may be any suitable number not less than one kind.

First, in step 25, the total capacitance of decoupling capacitors to be mounted, and the application ratio on the basis of each kind of the threshold voltage Vth are determined by a method shown with reference to working example 1. Next, a decoupling capacitor having a low threshold voltage Vth is disposed in step 26, a decoupling capacitor having a standard threshold voltage Vth is placed in step 27, and a decoupling capacitor having a high threshold voltage Vth is placed in step 28 in that order. Now, those decoupling capacitors are placed in that order for the following reason, however, sequence in which those decoupling capacitors are placed is not necessarily limited to that order, and the decoupling capacitors may be simultaneously placed. Because a parasitic resistance value of the decoupling capacitor having the low threshold voltage Vth is low, IR drop thereof is small. The reason why those decoupling capacitors are placed in the sequence described is that it is desirable to convergently dispose the decoupling capacitor having the low threshold voltage Vth in the vicinity of, for example, a high-speed operating circuit, and so forth, sensitive to the AC noise on power supply line, while placing the decoupling capacitor having the standard threshold voltage Vth, and the decoupling capacitor having the high threshold voltage Vth at other locations, respectively.

Figure 10:
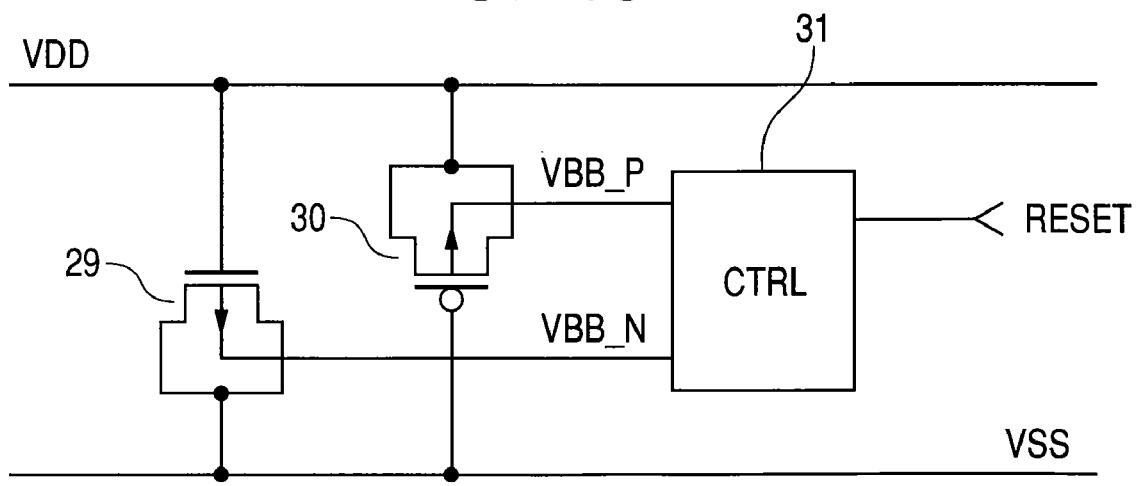
FIG. 10 is a view showing an example of circuit diagram for dynamically controlling the threshold voltage Vth.

In FIG. 10, there is shown an example of a circuit wherein the threshold voltage Vth is controlled by changing a substrate bias voltage of a MOS transistor. A control circuit 31 is a circuit for receiving a reset signal, thereby controlling the substrate bias voltage. MOS transistors 29, 30 make up a decoupling capacitor for suppressing the AC noise on power supply line. The respective substrate biases of the MOS transistors 29, 30 are controlled by the control circuit 31, and the respective threshold voltages Vth of the MOS transistors 29, 30 are changed according to an operating state of the circuit to thereby control the respective threshold voltages Vth such that the AC noise on power supply line is reduced to the minimum. More specifically, upon detection of the reset signal being turned from OFF to ON, the substrate bias voltage is adjusted during a time period over which the AC noise on power supply line due to resonance occurs, thereby causing the threshold voltages Vth to turn High. That will cause a parasitic resistance of the decoupling capacitor to increase, which will act as the damping resistance, thereby enabling the AC noise on power supply line to be suppressed.

The AC noise on power supply line due to the resonance will increase in the case where a large change in power consumption occurs. In this connection, the case of occurrence of a large change in power consumption includes timing immediately after the power source is turned on. If the threshold voltages Vth are turned High upon the occurrence of the resonance, this will cause the resistance Rch between the source and the drain to turn high, which will act as the parasitic resistance. There is no necessity of fixing the threshold voltages Vth, and the threshold voltages Vth may be changed according to the operating state of the circuit, thereby enabling the respective threshold voltages Vth to be controlled such that the AC noise on power supply line is reduced.

Figure 11:
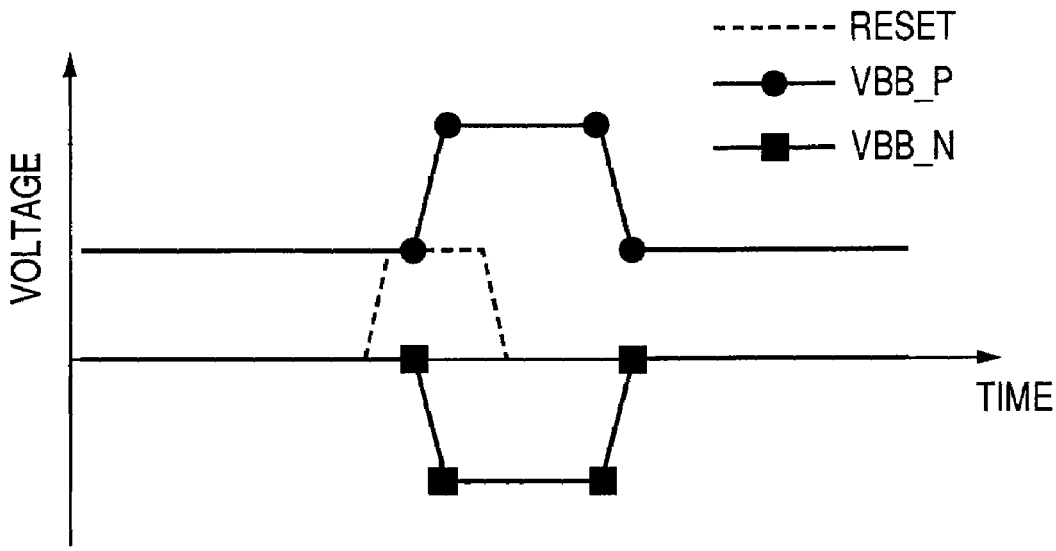
FIG. 11 is a view showing an example where a signal shown in FIG. 10 is controlled.

Furthermore, the occurrence of a large change in power consumption is not limited to the timing immediately after the power source is turned on, and it is obviously effective to turn the threshold voltages Vth High in other cases as well FIG. 11 shows a change in potential, at each of nodes shown in FIG. 10. In the initial state, a substrate bias potential of a PMOS transistor is set to the VDD potential, and a substrate bias potential of an NMOS transistor is set to the VSS potential.

At a point in time when the reset signal is turned effective (from Low to High), the substrate bias potential (VBB_P) of the PMOS transistor is changed to a potential higher than VDD while the substrate bias potential (VBB_N) of the NMOS transistor is changed to a potential lower than VSS. In the figure, there is shown a state where after the elapse of predetermined time, the VBB_P potential reverts to the VDD potential, and the VBB_N potential reverts to the VSS potential.

Figure 12:
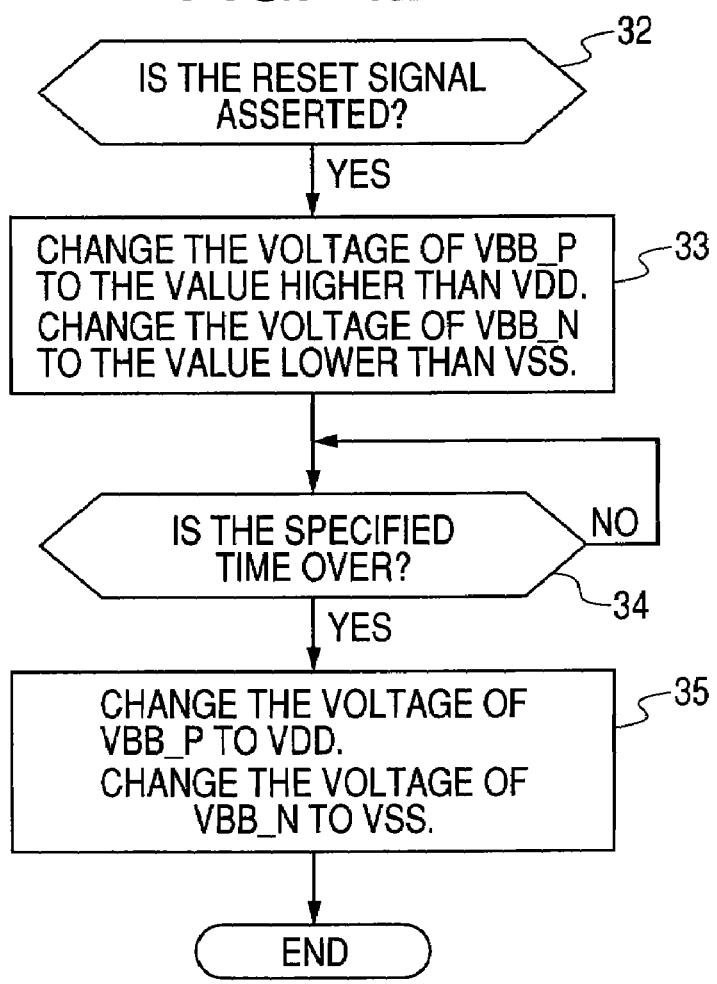
FIG. 12 is a view showing a control flow chart of the signal shown in FIG. 10.

FIG. 12 shows a control flow chart of respective nodes shown in FIG. 11. In step 32, the reset signal is detected, and in step 33, the substrate bias potential of the PMOS transistor is set to the potential higher than the VDD potential while the substrate bias potential of the NMOS transistor is set to the potential lower than the VSS potential such that the threshold voltage Vth of the decoupling capacitor is turned High. In step 34, checking is made on whether or not predetermined time for causing the AC noise on power supply line to be at the standard level or lower has elapsed. Thereafter, in step 35, the respective substrate bias potentials are caused to revert to an original state.

In FIGS. 10 to 12, respectively, the reset signal is used, however, use may be made of a signal for detecting a large change in power consumption. For example, in the case of a design using a gated clock, a power change occurs by gating (enabling or disabling) of the clock. Use may be made of a signal (an enable signal, and so forth) for controlling the enabling the disabling, in place of the reset signal.

Figure 13:
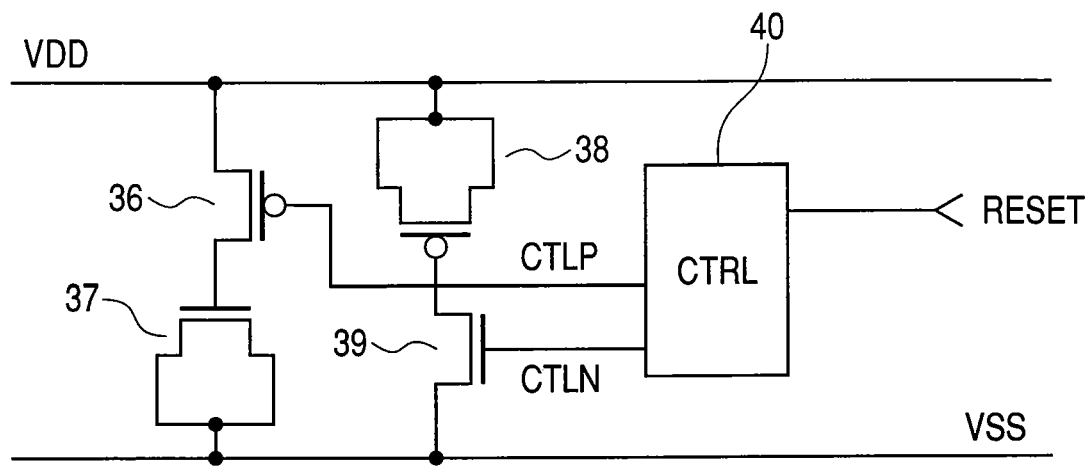
FIG. 13 is a circuit diagram of a variation of the circuit described with reference to FIG. 10.

FIG. 13 is a circuit diagram of a circuit intended for fulfilling the same function as that for the circuit described with reference to FIG. 9. A control circuit 40 is a circuit for receiving a reset signal, thereby controlling respective gate voltages of MOS transistors 36, 39. MOS transistors 37, 38 make up a decoupling capacitor for suppressing the AC noise on power supply line. Respective gate potentials of the MOS transistors 36, 39 are under control of the control circuit 40, and are changed according to an operating state of a circuit, thereby causing a source-to-drain resistance Rch of each of the MOS transistors 36, 39 to be changed.

Figure 14:
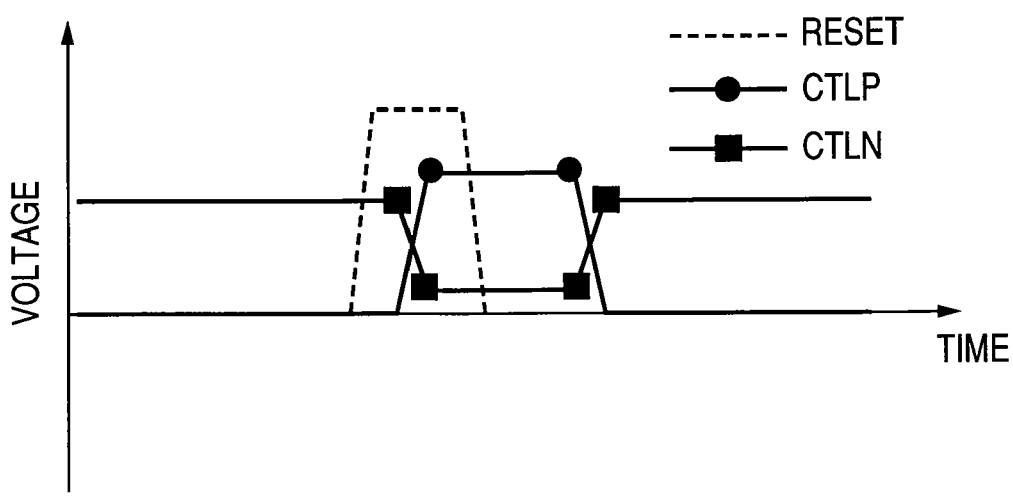
FIG. 14 is a view showing an example where a signal shown in FIG. 13 is controlled.

FIG. 14 shows a change in potential, at each of nodes shown in FIG. 13. In the initial state, the MOS transistors 36, 39 are in the ON-state, respectively, and are in such a state as is fixed to the VSS potential, and the VDD potential, respectively. The control circuit 40 detects that the reset signal is turned from OFF to ON to thereby turn a potential (CTLP) of the MOS transistor 36 higher than the VSS potential, and a potential (CTLN) of the MOS transistor 39 lower than the VDD potential. After the elapse of predetermined time, the CTLP potential is caused to revert to the VSS potential, and the CTLN potential is caused to revert to the VDD potential.

FIG. 15 shows a control flow chart of respective nodes shown in FIG. 13. In step 41, the reset signal is detected. In step 42, the CTLP potential, and the CTLN potential each are set to an intermediate potential between the VDD potential and the VSS potential such that the resistance Rch between the source and the drain of each of the MOS transistors 36, 39 is turned High. In step 43, checking is made on whether or not predetermined time for causing the AC noise on power supply line to be at the standard level or lower has elapsed. In step 44, the CTLP potential, and the CTLN potential each are caused to revert to an original potential.

By so doing, the AC noise on power supply line due to resonance can be suppressed as with the case shown in FIG. 10. More specifically, if resonance occurs, the source-to-drain resistance of the MOS transistor is temporarily increased, which will act as the damping resistance, so that the AC noise on power supply line can be suppressed.

In FIGS. 12 to 15, respectively, the reset signal is used; however, use may be made of a signal for detecting a large change in power consumption. For example, in the case of the design using the gated clock, power change occurs by gating (enabling or disabling) of the clock. Use may be made of a signal (the enable signal, and so forth) for controlling the enabling the disabling, in place of the reset signal.

Having specifically described the invention developed by the inventor, et al. with reference to the embodiment of the invention, it is to be understood that the invention be not limited thereto and it is obvious that various changes and modifications may be made in the invention without departing from the spirit and scope thereof.

What is claimed is:
1. A semiconductor integrated circuit device comprising:
   a logic circuit comprising MOS transistors having plural kinds of threshold voltages;

a decoupling capacitor comprising MOS transistors having the lowest kind of threshold voltage, wherein the logic circuit, and the decoupling capacitor are connected between power supply lines, and an operating voltage is fed from the respective power supply lines to the logic circuit.

2. A semiconductor integrated circuit device according to claim 1, wherein the decoupling capacitor is a cross-coupled decoupling capacitor.

3. A semiconductor integrated circuit device according to claim 1, wherein the respective threshold voltages Vth of the MOS transistors are controlled by an ion implantation process step.

4. A semiconductor integrated circuit device according to claim 1, further comprising a control circuit, wherein the control circuit increases an absolute value of the threshold voltage of each of the MOS transistors composing the decoupling capacitor in the case of a large change occurring to power consumption of the semiconductor integrated circuit device.

5. A semiconductor integrated circuit device according to claim 4, wherein the case of a large change occurring to the power consumption is the case where a reset signal is inputted or a time of gating of clock when a gated clock is in use.

6. A semiconductor integrated circuit device according to claim 1, further comprising:
a control circuit,
wherein the decoupling capacitor is connected between the power supply lines through the intermediary of the respective MOS transistors, and the control circuit increases resistance between a source and a drain of each of the MOS transistors, serving as a linkage for connection of the decoupling capacitor with the respective power supply lines in the case of a large change occurring to power consumption of the semiconductor integrated circuit device.

7. A method for manufacturing a semiconductor integrated circuit device comprising the steps of:
composing a logic circuit out of MOS transistors having plural kinds of threshold voltages; and
composing a decoupling capacitor out of MOS transistors having the lowest kind of threshold voltage, the decoupling capacitor being connected between power supply lines for feeding an operating voltage to the logic circuit.

8. A method for manufacturing a semiconductor integrated circuit device, according to claim 7, wherein the decoupling capacitor is a cross-coupled decoupling capacitor.

* * * * *